United States Patent [19]
Friedrich

[11] 4,073,990
[45] Feb. 14, 1978

[54] APPARATUS FOR ADJUSTING A SEMICONDUCTOR WAFER BY ELECTRON BEAM ILLUMINATION

[75] Inventor: Hans Friedrich, Poering, Germany

[73] Assignee: Siemens Aktiengesellschaft, Berlin & Munich, Germany

[21] Appl. No.: 684,081

[22] Filed: May 7, 1976

[30] Foreign Application Priority Data

May 9, 1975 Germany .............................. 2520743

[51] Int. Cl.² ...................... H01L 21/306; B44C 1/22; C03C 15/00; C03C 25/06
[52] U.S. Cl. .................................... 428/138; 156/657; 156/659; 156/662; 427/82; 427/240; 427/271; 427/309; 428/173
[58] Field of Search ...................... 204/159.14, 159.16; 29/578, 580; 427/82, 240, 271, 307, 309; 428/138, 167, 173; 250/492 R, 492 A, 397; 96/38.4; 156/632, 653, 657, 659, 662

[56] References Cited

U.S. PATENT DOCUMENTS

| 3,705,060 | 12/1972 | Stork | 219/121 EB |
| 3,759,767 | 9/1973 | Walls | 29/578 X |
| 3,783,228 | 1/1974 | Tarui et al. | 219/121 EB |
| 3,875,414 | 4/1975 | Prior | 250/492 A |

*Primary Examiner*—William A. Powell
*Attorney, Agent, or Firm*—Hill, Gross, Simpson, Van Santen, Steadman, Chiara & Simpson

[57] ABSTRACT

An apparatus and process is disclosed for the adjustment of a semiconductor wafer by electron beam illumination. An adjustment mark is provided in a semiconductor wafer having a first layer thereon. The mark is formed as a recess which extends through an aperture in the first layer and into the semiconductor wafer. The width of the recess is not greater than its depth. An electron sensitive lacquer layer is provided on the first layer and in a bottom of the recess.

5 Claims, 6 Drawing Figures

APPARATUS FOR ADJUSTING A SEMICONDUCTOR WAFER BY ELECTRON BEAM ILLUMINATION

BACKGROUND OF THE INVENTION

1. Field of the Invention

This invention relates to a process and apparatus for adjusting a semiconductor wafer by electron beam illumination.

2. Description of the Prior Art

In the production of semiconductor components, photolithographic etching techniques are used to etch structures in semiconductor wafers or in layers arranged on the semiconductor wafers. Irradiation masks are optically aligned on light-sensitive lacquer which is arranged on the semiconductor wafer. In addition to light-optical projection and copying processes, electron-optical processes are also used. In comparison to the light-optical projection process, the electron-optical processes have the advantage that projection inaccuracies caused by diffraction phenomena are less. When electron-optical projection and copying processes are used, the semiconductor wafers provided with an electron-sensitive lacquer must be adjusted in relation to the irradiation mask. In the case of electron beam alignment, in which an electron beam deflected by electromagnetic means automatically produces an illuminated area on a radiation-sensitive lacquer layer, the semiconductor wafer must be adjusted with respect to a radiation reference which is struck by the non-deflected beam. This adjustment must be highly accurate, particularly when the semiconductor wafer is provided with existing structures, which, in the production of a semiconductor device, must have a definite position in relation to the subsequently applied structures.

In accordance with the prior art, the adjustment with the aid of an electron beam is effected by moving the beam across an adjustment mark in the form of a stage arranged on the semiconductor wafer. When the electron beam penetrates into the material comprising the adjustment mark, it releases secondary or backscatter electrons which move away from the adjustment mark in a direction which is different to the direction of the oncoming electron beam. The secondary electrons and the backscatter electrons are intercepted by a detector. For purposes of adjustment, either the semiconductor wafer or the electron beam source is displaced until the detector supplies the desired signal. When the semiconductor wafer and the adjustment mark in the form of a stage on the semiconductor wafer are coated with an electron sensitive lacquer, as is necessary when an electron-optical illuminating process is being used, the signal produced by the backscatter and secondary electrons is considerably flattened and blurred. This results since the secondary and backscatter electrons are subject to additional scatter processes in the overlying electronsensitive lacquer. Blurred and unclear signals of this type are not very suitable, particularly for automatic adjustment. Also, a further complication arises since for secondary and backscatter electrons, the signal to noise ratio is small.

SUMMARY OF THE INVENTION

It is an object of this invention to provide an adjustment mark which considerably increases the sharpness of the adjustment signal when adjusting a semiconductor wafer.

The use of the adjustment mark of this invention ensures that in a semiconductor wafer coated with an electron sensitive lacquer, when an electron beam passes over the adjustment mark a large proportion of the secondary and backscattered electrons produced in the recess are not detected since the recess acts as a Faraday cage and thus prevents the electrons from emerging from the recess. This considerably increases the sharpness of the signal and allows an automatic adjustment to be carried out with greater reliability, accuracy and speed. One or more recesses are provided in circular cross-section and have widths which are less than or equal to their depth in order to provide as effective a Faraday cage as possible.

DESCRIPTION OF THE PREFERRED EMBODIMENTS

The adjustment mark consists of a recess 4 which extends into the semiconductor 1 through both an electron sensitive lacquer layer 3 and a first layer 2 arranged on the semiconductor wafer. The material selected for layer 2 is that which is applied to the semiconductor wafer in one of the first process steps for the production of a semiconductor device in the wafer. In the case of a silicon semiconductor wafer, this layer may consist of $SiO_2$ or $Si_3N_4$.

The adjustment mark is formed such that the opening in the first layer 2 has a smaller width than the opening of the recess in the semiconductor body. This structure is created by under-etching the first layer.

Figure 1:
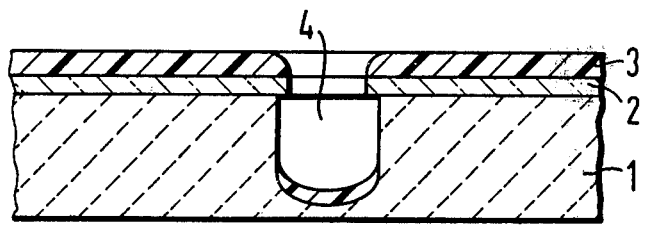
FIG. 1 illustrates a portion of a semiconductor wafer in cross-section with an adjustment mark.
Figure 2:
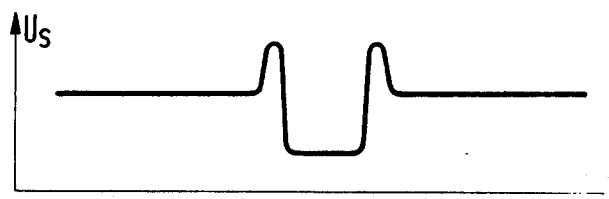
FIG. 2 illustrates the signal voltage $U_s$ which is produced by the secondary electrons and backscatter electrons at the detector when an electron beam passes over the adjustment mark.
Figure 3:
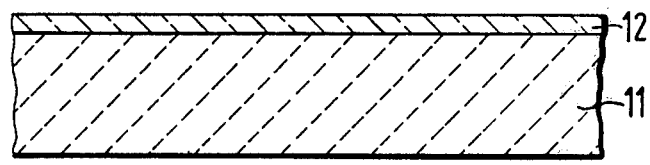
FIGS. 3 to 6 illustrate the production process for the adjustment mark of this invention.
Figure 4:
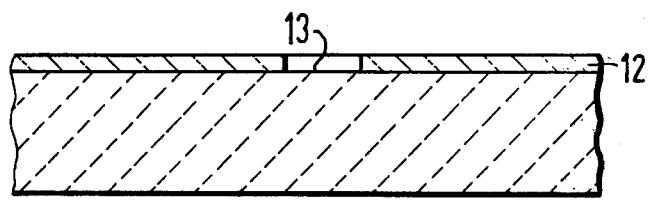
Figure 5:
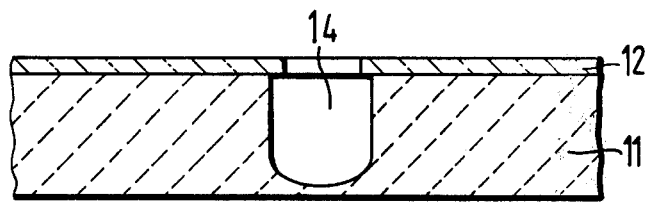
Figure 6:
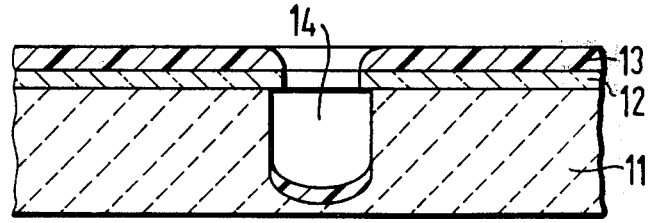

The process for producing the adjustment mark is as follows. As shown in FIG. 3, a semiconductor wafer 11 (for example, a silicon wafer) is covered with a first layer 12, (for example, an oxide layer) which is appropriate for the semiconductor device to be produced. This silicon wafer preferably has a specific resistance of between approximately $0.1\Omega/cm$ and $10\Omega/cm$. As shown in FIG. 4, a photolithographic process is then used to etch an opening into this first layer. This opening has, for example, the shape of a grip cross or "L". Following the production of this opening, an exposed part 13 of the semiconductor wafer is etched and removed to a depth of approximately 3 to 5 $\mu m$ as shown in FIG. 5. At the same time, the layer 12 is under-etched so that the width of the recess contained in the semiconductor wafer is somewhat greater than the width of the opening through the first layer. This serves to further impede the electrons which have backscattered in the semiconductor from emerging. Following the etching of the semiconductor wafer as shown in FIG. 6, an electron sensitive lacquer 13 is applied such as by centrifuging. In this step the first layer 12 arranged on the semiconductor wafer and the base of the recess 14 contained in the semiconductor wafer are covered by the electron sensitive laquer. Further processing of the semiconductor wafer is carried out in accordance with known processes.

If an electron sensitive lacquer is used in the production of the adjustment mark for the photolithographic etching process, then following production of the adjustment mark, a copying mask can be laid on this lacquer layer and the lacquer layer can then be developed.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. Apparatus for the adjustment of a semiconductor wafer by electron beam illumination whereby the position of the semiconductor wafer is established by detecting signals corresponding to the electron beam illumination, comprising:
    a. a semicondcutor wafer having a first layer thereon;
    b. an adjustment mark provided in the semiconductor wafer as a recess which extends through an aperture in the first layer and into the semiconductor wafer, the width of said recess being not greater than its depth; and
    c. an electron sensitive lacquer layer arranged on the first layer whereby the depth of said recess in relation to its width functions as a cage for capturing a large proportion of secondary and back-scattered electrons to permit more precise alignment.

2. The apparatus of claim 1, characterized in that the width of the recess is selected to be between approximately 1 $\mu$m and 5 $\mu$m.

3. The apparatus of claim 1, characterized in that the width of the recess in the semiconductor body is greater than the width of the aperture in the first layer.

4. The apparatus of claim 1, characterized in that the adjustment mark is formed as a grid cross.

5. Apparatus for the adjustment of a semiconductor wafer by electron beam illumination comprising:
    a. a semiconductor layer having a first layer thereon;
    b. an adjustment mark provided in the semiconductor wafer as a recess which extends through an aperture in the first layer and into the semiconductor wafer, the width of said recess being not greater than its depth; and
    c. an electron sensitive lacquer layer provided on the first layer and in a bottom of said recess.

* * * * *